(12) United States Patent
Liu et al.

(10) Patent No.: US 9,673,333 B2
(45) Date of Patent: Jun. 6, 2017

(54) P-SI TFT AND METHOD FOR FABRICATING THE SAME, ARRAY SUBSTRATE AND METHOD FOR FABRICATING THE SAME, AND DISPLAY DEVICE

(71) Applicant: BOE TECHNOLOGY GROUP CO., LTD., Beijing (CN)

(72) Inventors: Zheng Liu, Beijing (CN); Xiaoyong Lu, Beijing (CN); Xiaolong Li, Beijing (CN); Yu-Cheng Chan, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/122,066

(22) PCT Filed: Feb. 22, 2016

(86) PCT No.: PCT/CN2016/074211
§ 371 (c)(1),
(2) Date: Aug. 26, 2016

(87) PCT Pub. No.: WO2016/145967
PCT Pub. Date: Sep. 22, 2016

(65) Prior Publication Data
US 2017/0018652 A1   Jan. 19, 2017

(30) Foreign Application Priority Data

Mar. 17, 2015  (CN) .......................... 2015 1 0116969

(51) Int. Cl.
*H01L 29/786* (2006.01)
*H01L 27/02* (2006.01)
*H01L 27/12* (2006.01)

(52) U.S. Cl.
CPC ........ *H01L 29/78621* (2013.01); *H01L 27/02* (2013.01); *H01L 27/124* (2013.01);
(Continued)

(58) Field of Classification Search
CPC ............. H01L 29/78621; H01L 29/786; H01L 29/78645; H01L 29/78675;
(Continued)

(56) References Cited

U.S. PATENT DOCUMENTS 9,401,376 B2 *  7/2016  Hsu ....................... H01L 27/127
2006/0030089 A1   2/2006  Chung
(Continued)

FOREIGN PATENT DOCUMENTS

| CN | 1355554 A | 6/2002 |
|---|---|---|
| CN | 103151388 | 6/2013 |

(Continued)

OTHER PUBLICATIONS

PCT International Search Report, PCT/CN2016/074211, May 13, 2016, 21 pp.
(Continued)

*Primary Examiner* — Tu-Tu Ho
(74) *Attorney, Agent, or Firm* — Armstrong Teasdale LLP

(57) ABSTRACT

A method for fabricating a Polysilicon Thin-Film Transistor is provided. The method includes forming a polysilicon active layer, forming a first gate insulation layer and a first gate electrode sequentially on the active layer, conducting a first ion implantation process on the active layer by using the first gate electrode as a mask to form two doped regions at ends of the active layer, forming a second gate insulation layer and a second gate electrode sequentially on the first gate insulation layer and the first gate electrode, and conducting a second ion implantation process on the active layer by using the second gate electrode as another mask to form two source/drain implantation regions at two outer sides of the doped regions of the active layer. Accordingly, impurity concentration of the two doped regions is smaller than that of the two source/drain implantation regions.

20 Claims, 4 Drawing Sheets

(52) U.S. Cl.
CPC ........ *H01L 27/127* (2013.01); *H01L 27/1222* (2013.01); *H01L 27/1255* (2013.01); *H01L 27/1288* (2013.01); *H01L 29/786* (2013.01); *H01L 29/78645* (2013.01); *H01L 29/78675* (2013.01); *H01L 29/78696* (2013.01)

(58) Field of Classification Search
CPC ............... H01L 29/78696; H01L 27/02; H01L 27/1222; H01L 27/124; H01L 27/1255; H01L 27/127; H01L 27/1288
USPC .......................................................... 257/71
See application file for complete search history.

(56) References Cited

U.S. PATENT DOCUMENTS

| | | |
|---|---|---|
| 2011/0133264 A1 | 6/2011 | Jan et al. |
| 2014/0225075 A1 | 8/2014 | Zhan |

FOREIGN PATENT DOCUMENTS

| | | |
|---|---|---|
| CN | 104218091 A | 12/2014 |
| CN | 104681628 | 6/2015 |

OTHER PUBLICATIONS

China Office Action, Application No. 201510116969.X, dated Feb. 28, 2017, 18 pps.: with English Translation.

\* cited by examiner

P-SI TFT AND METHOD FOR FABRICATING THE SAME, ARRAY SUBSTRATE AND METHOD FOR FABRICATING THE SAME, AND DISPLAY DEVICE

CROSS-REFERENCE TO RELATED APPLICATION

This application is a National Stage entry of PCT/CN2016/074211 filed Feb. 22, 2016, which claims the benefit and priority of Chinese Patent Application No. 201510116969.X, which was filed on Mar. 17, 2015, both of which are incorporated herein by reference in their entirety.

BACKGROUND

The present disclosure relates to the field of displaying technology, in particular to a Polysilicon Thin-Film Transistor (P-Si TFT) and a method for fabricating the same, an array substrate and a method for fabricating the same, and a display device.

As compared with amorphous silicon (a-Si) array substrates, low-temperature Polysilicon (P-Si) array substrates is characterized in advantages such as high mobility (even several hundred times as high as that of a-Si). Accordingly, Thin-Film Transistors (TFTs) on a P-Si array substrate can be made very small in size and have a fast response. Today, such a P-Si array substrate is a prevailing array substrate for a display panel, and has been widely applied in the field of Organic Light Emitting Display (OLED) panel and Liquid Crystal Display (LCD) panel for having both high resolution and good displaying quality.

However, a low-temperature Polysilicon Thin-Film Transistor (P-Si TFT) is of a complex composition and needs more fabricating processes than other kinds of TFTs. As a result, it is time-consuming and cost-consuming for design and mass production of P-Si TFTs. It is also challenging to monitor and is inferior in terms of stability. For example, as shown in FIG. 1, with respect to such a storage capacitor structure of the low-temperature P-Si array substrate formed by two layers of gate electrode metal in related arts, it is quite vulnerable in terms of high leakage electricity and poor reliability. As shown in FIG. 1, reference numeral 1 represents a base substrate, reference numeral 2 represents an active layer, reference numeral 3 represents a first gate insulation layer, reference numeral 4 represents a first gate electrode, reference numeral 5 represents a second gate insulation layer, reference numeral 6 represents a storage capacitor bottom electrode, and reference numeral 7 represents a storage capacitor top electrode. It is clear that these components illustrated by reference numerals 1~7 constitute a P-Si TFT on the left and a storage capacitor on the right as shown in FIG. 1.

BRIEF DESCRIPTION

The present disclosure provides in some embodiments a Polysilicon Thin-Film Transistor (P-Si TFT) and a method for fabricating the same, an array substrate and a method for fabricating the same, and a display device, so as to solve the above addressed technical problems, such as high leakage electricity and poor stability.

In one aspect, embodiments of the present disclosure provide a method for fabricating a P-Si TFT, which includes forming a polysilicon active layer, forming a first gate insulation layer and a first gate electrode sequentially on the active layer, wherein a projection of the first gate electrode locates between two edges at both ends of the active layer, conducting a first ion implantation process on the active layer by using the first gate electrode as a mask, so as to form two doped regions at both ends of the active layer, forming a second gate insulation layer and a second gate electrode sequentially on the first gate insulation layer and the first gate electrode, wherein projections of two edges at both ends of the second gate electrode locate between the projection of the first electrode and two edges at both ends of the active layer, respectively, conducting a second ion implantation process on the active layer by using the second gate electrode as another mask, so as to form two source/drain implantation regions at two outer sides of the two doped regions of the active layer. And an impurity concentration of the doped regions is smaller than that of the source/drain implantation regions.

In one possible embodiment, an amount of ions implanted by the first ion implantation process is lower than that of ions implanted by the second ion implantation process.

In one possible embodiment, the amount of ions implanted by the first ion implantation process is within a range of $1 \times 10^{12} \sim 1 \times 10^{14}$ atoms/cm$^3$, and/or the amount of ions implanted by the second ion implantation process is within a range of $1 \times 10^{14} \sim 1 \times 10^{18}$ atoms/cm$^3$.

In another aspect, embodiments of the present disclosure provide a method for fabricating an array substrate, which includes providing a base substrate and forming the above described Polysilicon Thin-Film Transistors (P-Si TFTs) on the base substrate.

In one possible embodiment, the method further includes forming a storage capacitor bottom electrode on the first gate insulation layer corresponding to a predetermined storage capacitor region and forming a storage capacitor top electrode on the second gate insulation layer corresponding to the storage capacitor bottom electrode.

In one possible embodiment, the storage capacitor bottom electrode and the first gate electrode are formed simultaneously; and the storage capacitor top electrode and the second gate electrode are formed simultaneously.

In one possible embodiment, the method further includes forming a buffer layer on the base substrate, subsequent to providing the base substrate and prior to forming the P-Si TFT active layer.

In one possible embodiment, the buffer layer is made of silica, silicon nitride, or a laminate thereof.

In another aspect, embodiments of the present disclosure provide a P-Si TFT, which includes a polysilicon active layer that includes a center region, two doped regions arranged at two outer sides of the center region respectively, and two source/drain implantation regions arranged at two outer sides of the two doped regions respectively, a first gate insulation layer and a first gate electrode arranged on the active layer, wherein projections of two edges at both ends of the first gate electrode coincide with those of two edges at both ends of the center region respectively, and a second gate insulation layer and a second gate electrode arranged on the first gate insulation layer and the first gate electrode, wherein projections of two edges at both ends of the second gate electrode coincide with those of two edges at two outermost ends of the two lightly doped regions respectively. And an impurity concentration of the doped regions is smaller than that of the source/drain implantation regions.

In one possible embodiment, a thickness of the active layer is within a certain range of 100 Å~3000 Å.

In one possible embodiment, the first gate insulation layer and/or the second gate insulation layer is/are made of silica, silicon nitride, or a laminate thereof, and the thickness thereof is within a certain range of 500 Å~2000 Å.

In one possible embodiment, the first gate electrode and/or the second gate electrode is made of metal and/or metal alloy, and the thickness thereof is within a certain range of 1000 Å~5000 Å.

In another aspect, embodiments of the present disclosure provide an array substrate, which includes a base substrate, and the above described P-Si TFTs arranged on the base substrate.

In one possible embodiment, the array substrate further includes storage capacitors each including a storage capacitor bottom electrode formed on the first gate insulation layer and a storage capacitor top electrode formed on the second gate insulation layer.

In one possible embodiment, the array substrate further includes a buffer layer arranged between the base substrate and the polysilicon active layer.

In one possible embodiment, the buffer layer is made of silica, silicon nitride, or a laminate thereof.

In another aspect, embodiments of the present disclosure provide a display device, which includes the above described array substrate.

According to the P-Si TFT and the method for fabricating the same, the array substrate for fabricating the same, and a display device provided by embodiments of the present disclosure, Lightly Doped Drain (LDD) regions can be formed simultaneously as a storage capacitor within a TFT, without additional mask(s), by conducting one or more ion implantation process/processes with dual layers of gate electrode metal as masks provided by the related arts, thereby reducing leakage electricity of the TFT and improving stability thereof.

BRIEF DESCRIPTION OF THE DRAWINGS

In order to illustrate the technical solutions of the present disclosure or the related art in a more apparent manner, the drawings desired for the embodiments of the present disclosure will be described briefly hereinafter. The following drawings merely relate to some embodiments of the present disclosure, and based on these drawings, a person skilled in the art may obtain the other drawings without any creative effort.

DETAILED DESCRIPTION

In order to make the technical solutions and the advantages of the present disclosure more apparent, the present disclosure will be described hereinafter in a clear and complete manner in conjunction with the drawings and embodiments. The following embodiments are merely a part of, rather than all of, the embodiments of the present disclosure. Based on these embodiments, a person skilled in the art may obtain the other embodiments, which also fall within the scope of the present disclosure.

Such words as "first" and "second" used in the specification and claims are merely used to differentiate different components rather than to represent any order, number, or importance. It is well known in the art that "forming" respective layers indicates sputtering and depositing respective layers of materials, and one or more patterning processes on the materials, such as an etching process, may be needed if necessary. A sequence of steps of any methods provided by embodiments of the present disclosure is not only limited to the one described in the specification, but some of steps can be re-adjusted in sequence or can concurrently happen.

As used herein and in the appended claims, the singular form of a word includes the plural, and vice versa, unless the context clearly dictates otherwise. Thus, the references "a", "an", and "the" are generally inclusive of the plurals of the respective terms. Likewise, the terms "include", "including", and "having" should all be construed to be inclusive of features, integrals, steps, operations, elements, and/or parts, unless such features, integrals, steps, operations, elements, and/or parts are clearly prohibited from the context, which does not exclude one or more other features, integrals, steps, operations, elements, and/or parts from the present disclosure.

Figure 1:
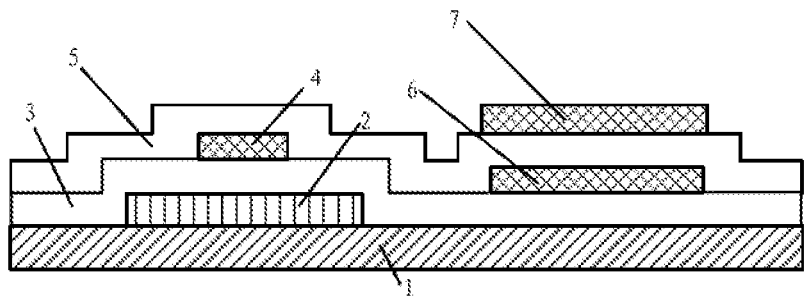
FIG. 1 is a schematic diagram illustrating a structure of a Thin-Film Transistor (TFT) according to the related art.
Figure 2:
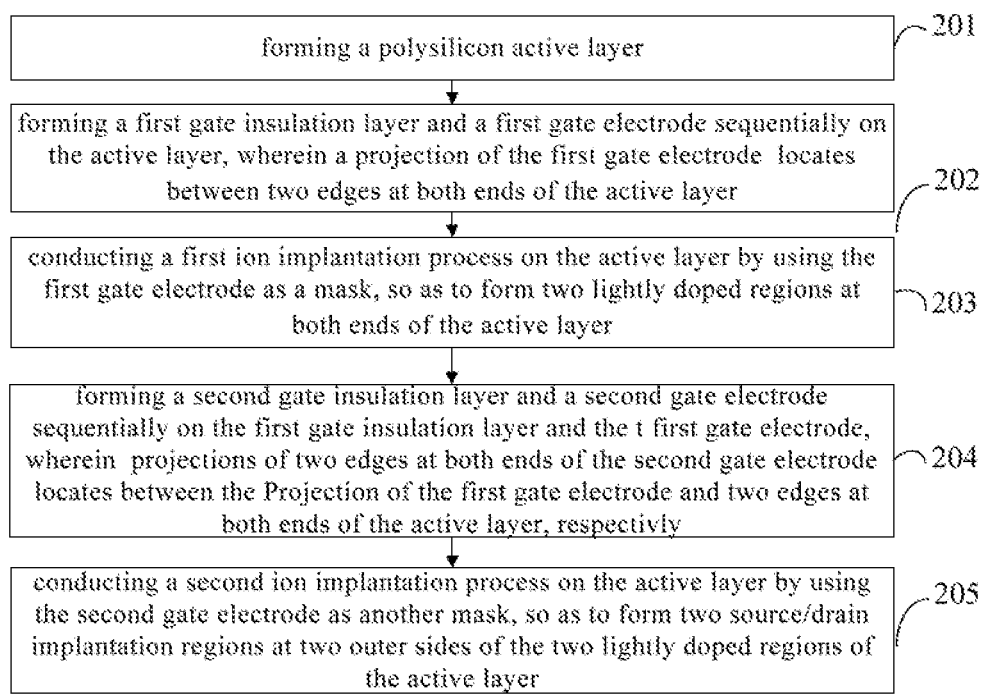
FIG. 2 is a flow chart illustrating a method for fabricating a Polysilicon Thin-Film Transistor (P-Si TFT) according to a certain embodiment of the present disclosure.

As shown in FIG. 2, which is a flow chart illustrating a method for fabricating a Polysilicon Thin-Film Transistor (P-Si TFT) according to a certain embodiment of the present disclosure, the method includes:

Step 201, forming a polysilicon active layer;

Step 202, forming a first gate insulation layer and a first gate electrode sequentially on the active layer, wherein a projection of the first gate electrode (i.e., a projection of the first gate electrode on the active layer) locates between two edges at both ends of the active layer;

Step 203, conducting a first ion implantation process on the active layer by using the first gate electrode as a mask, so as to form two doped regions at both ends of the active layer;

Step 204, forming a second gate insulation layer and a second gate electrode sequentially on the resultant first gate insulation layer and the resultant first gate electrode, wherein projections of two edges at both ends of the second gate electrode locate between the projection of the first electrode and two edges at both ends of the active layer, respectively; and Step 205, conducting a second ion implantation process on the active layer by using the second gate electrode as another mask, so as to form two source/drain implantation regions at two outer sides of the two doped regions of the active layer.

Specifically, due to the fact that there is one gate insulation layer and two gate insulation layers with respect to the first and second ion implantation processes, an amount of ions implanted by the first ion implantation process is lower than that of ions implanted by the second ion implantation process. Alternatively, the amount of ions implanted by the first ion implantation process is within a range of $1\times10^{12}$~$1\times10^{14}$ atoms/cm3, while the amount of ions implanted by the second ion implantation process is within a range of $1\times10^{12}$~$1\times10^{18}$ atoms/cm3. Also, subsequent to the second ion implantation process, because impurity concentration of the two doped regions is smaller than that of the two source/drain implantation regions, the two doped regions may be referred to as lightly doped regions.

Figure 3:
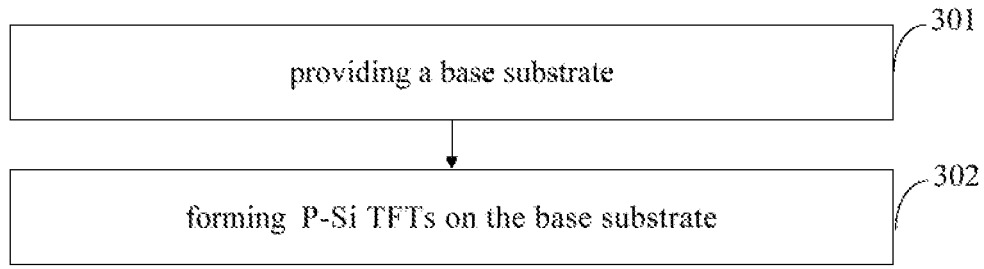
FIG. 3 is a flow chart illustrating a method for fabricating an array substrate according to a certain embodiment of the present disclosure.

As shown in FIG. 3, which is a flow chart illustrating a method for fabricating an array substrate according to a certain embodiment of the present disclosure, the method includes:

Step 301, providing a base substrate;

Step 302, forming the above described P-Si TFTs on the base substrate.

Specifically, the method may include a step for fabricating a storage capacitor region, which further includes forming a storage capacitor bottom electrode on the first gate insulation layer corresponding to a predetermined storage capacitor region and forming a storage capacitor top electrode on the second gate insulation layer corresponding to the storage capacitor bottom electrode.

Specifically, the storage capacitor bottom electrode and the first gate electrode are formed simultaneously, while the storage capacitor top electrode and the second gate electrode are formed simultaneously.

Moreover, in order to prevent metal ion impurity in the base substrate from diffusing into the active layer to adversely affect the working performance of the TFT, a buffer layer may be formed on the base substrate, which may be made of silica, silicon nitride, or a laminate thereof.

Figure 4:
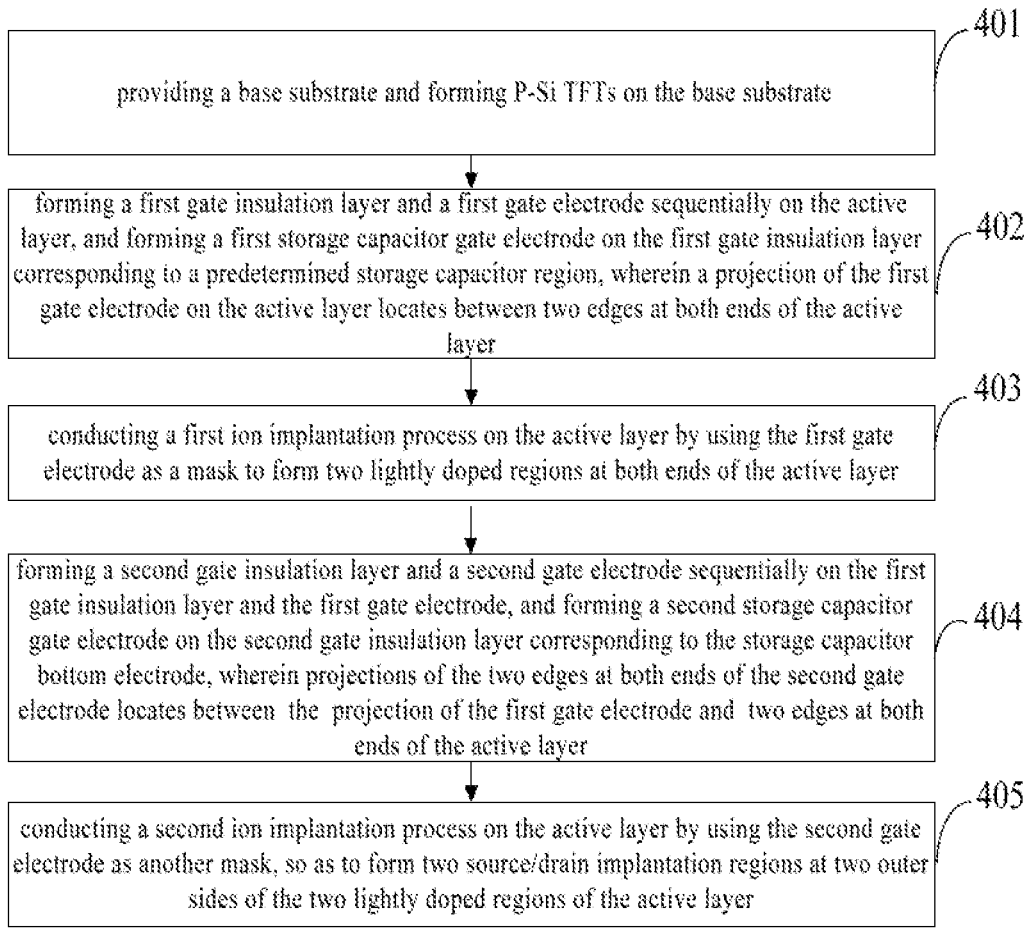
FIG. 4 is a flow chart illustrating a method for fabricating a display device according to a certain embodiment of the present disclosure.

Further, embodiments of the present disclosure also provide a method for fabricating an array substrate. As shown in FIG. 4, the method includes steps 401~405.

In step 401, a base substrate is provided, and P-Si TFTs are formed on the base substrate.

Figure 5:
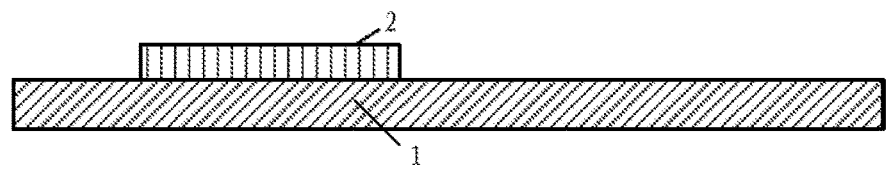
FIG. 5 is a schematic diagram illustrating an active layer that is formed according to a certain embodiment of the present disclosure.

As shown in FIG. 5, in step 401, the base substrate 1 may be a transparent substrate, such as cleansed glass in advance. A buffer layer may be formed on the base substrate 1, which may be made of silica, silicon nitride, or a laminate thereof, so as to prevent metal ion impurity in the base substrate from diffusing into the active layer to adversely affect the working performance of the TFT. The P-Si active layer 2 formed on the base substrate 1 may derive from an a-Si layer, formed under 600 degrees or below, by a Plasma Enhanced Chemical Vapor Deposition (PECVD) process, a Low-Pressure Chemical Vapor Deposition (LPCVD) process, or a sputtering process. Then the a-Si layer may be converted into a P-Si layer by an Excimer Laser Annealing (ELA) process, a Metal Induced Crystallization (MIC) process, or a Solid Phase Crystallization (SPC) process. It needs to be appreciated that, according to different crystallization processes used, specific process procedures and a structure of the array substrate may be different to some extent. Although technical effects achieved by different embodiments of the present disclosure can be realized, one or more additional processes may be incorporated into the fabricating procedure, such as a heat treatment dehydrogenation process, a deposition induced metal process, a heat treatment crystallization process, an excimer laser irradiation crystallization process, a doping process (P-type doping or N-type doping) on the source/drain regions, and a doped impurity activation process. Specifically, a thickness of the active layer 2 is within a certain range of 100 angstroms (Å)~3000 Å. In a certain embodiment, a thickness of the active layer 2 is within a certain range of 500 Å~1000 Å.

In step 402, a first gate insulation layer and a first gate electrode are formed sequentially on the active layer, and a storage capacitor bottom electrode is formed on the first gate insulation layer corresponding to a predetermined storage capacitor region. And a projection of the first gate electrode on the active layer locates between two edges at both ends of the active layer.

Figure 6:
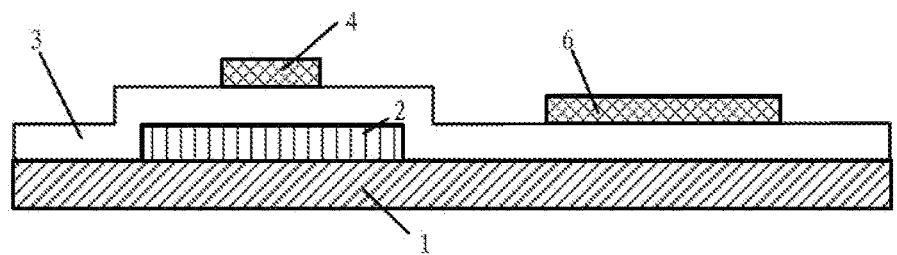
FIG. 6 is a schematic diagram illustrating a first gate insulation layer, a first gate electrode, and a storage capacitor bottom electrode that are formed according to a certain embodiment of the present disclosure.

As shown in FIG. 6, in step 402, the first gate insulation layer 3 is first formed on the active layer 2. Subsequently, the first gate electrode 4 and the storage capacitor bottom electrode 6 are formed on the resultant first gate insulation layer 3. Further, a projection of the first gate electrode 4 on the active layer 2 locates between two edges at both ends of the active layer 2.

In step 403, a first ion implantation process is conducted on the active layer by using the first gate electrode as a mask, so as to form two doped regions at two ends of the active layer.

Figure 7:
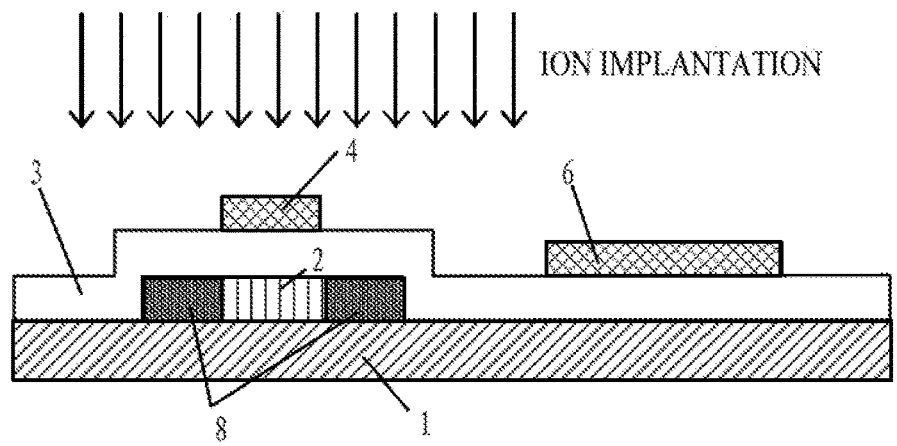
FIG. 7 is a schematic diagram illustrating a first ion implantation process according to a certain embodiment of the present disclosure.

As shown in FIG. 7, two doped regions 8 are formed at two ends of the active layer 2, by conducting an ion implantation process using the first gate electrode 4 as a mask.

In step 404, a second gate insulation layer and a second gate electrode are formed sequentially on the first gate insulation layer and the first gate electrode, while a storage capacitor top electrode is formed on the second gate insulation layer corresponding to the storage capacitor bottom electrode. The projections of two edges at both ends of the second gate electrode locate between the projection of the first electrode and two edges at both ends of the active layer, respectively.

Figure 8:
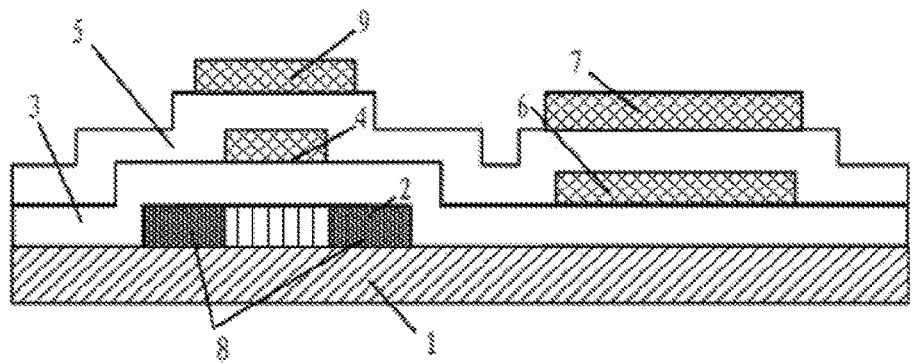
FIG. 8 is a schematic diagram illustrating a second gate insulation layer, a second gate electrode, and a storage capacitor top electrode that are formed according to a certain embodiment of the present disclosure.

As shown in FIG. 8, in step 404, the second gate insulation layer 5 is formed on the first gate insulation layer 3, the first gate electrode 4, and the storage capacitor bottom electrode 6. Subsequently, the second gate electrode 9 and the storage capacitor top electrode 7 are formed. Projections of two edges at both ends of the second gate electrode 9 locate between the projection of the first electrode 4 and two edges at both ends of the active layer 2, respectively.

In step 405, a second ion implantation process is conducted on the active layer by using the second gate electrode as another mask, so as to form two source/drain implantation regions at outer sides of the two doped regions of the active layer.

Figure 9:
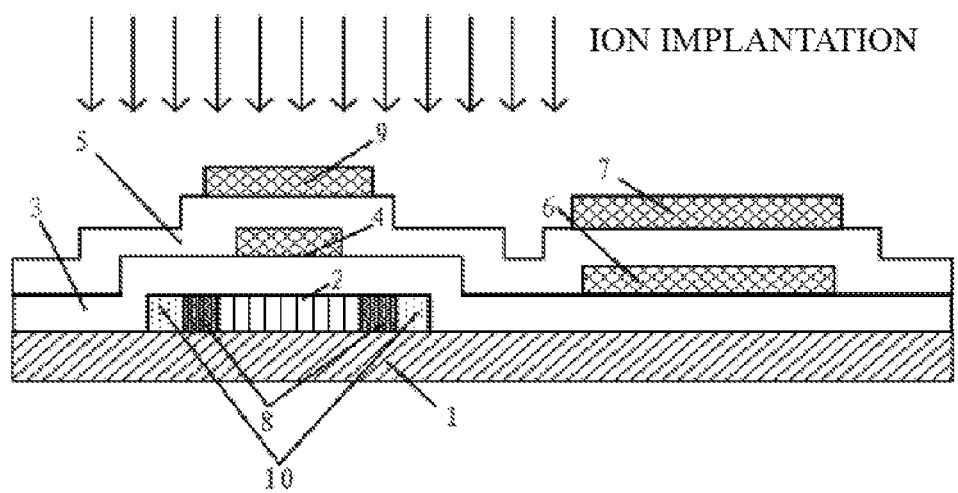
FIG. 9 is a schematic diagram illustrating a second ion implantation process according to a certain embodiment of the present disclosure.

As shown in FIG. 9, in step 405, a second ion implantation process is conducted on the active layer 2 by using the second gate electrode 9 as another mask, so as to form two source/drain implantation regions 10 at two outer sides of the two doped regions 8 of the active layer 2.

Specifically, the first gate insulation layer 3 and the second gate insulation layer 5 may be a single layer of silica, or a single layer of silicon nitride, or a laminate thereof. The first gate insulation layer 3 and the second gate insulation layer 5 may be obtained by a PECVD process, a LPCVD process, an Atmospheric-Pressure Chemical Vapor Deposition (APCVD) process, or an Electron-Cyclotron Resonance Chemical Vapor Deposition (ECR-CVD) process. A thickness of the first gate insulation layer 3 and the second gate insulation layer 5 may be within a certain range of 500

Å~2000 Å and can be determined according to actual design needs. In a certain embodiment, a thickness of the first gate insulation layer 3 and the second gate insulation layer 5 may be within a certain range of 600 Å~1500 Å. Further, the first gate electrode 4 and the second gate electrode 9 as well as the storage capacitor bottom electrode 6 and the storage capacitor top electrode 7 may be of a single layer, double layers, or a structure having more than two layers. The first gate electrode 4 and the second gate electrode 9 as well as the storage capacitor bottom electrode 6 and the storage capacitor top electrode 7 may be made of metal or metal alloy, such as molybdenum (Mo), aluminum (Al), molybdenum tungsten (MoW). A thickness of the first gate electrode 4 and the second gate electrode 9 as well as the storage capacitor bottom electrode 6 and the storage capacitor top electrode 7 may be within a certain range of 1000 Å~5000 Å. In a certain embodiment, a thickness of the first gate electrode 4 and the second gate electrode 9 as well as the storage capacitor bottom electrode 6 and the storage capacitor top electrode 7 may be within a certain range of 1500 Å~4000 Å. Accordingly, the first gate electrode 4 and the second gate electrode 9 as well as the storage capacitor bottom electrode 6 and the storage capacitor top electrode 7 constitute gate electrodes of the TFT and masks for ion implantation processes on the left, as well as the upper and lower electrodes of the storage capacitor on the right, as shown in FIG. 9.

The first and second ion implantation processes may choose from a group of an ion implantation process with a mass analyzer, an ion cloud implantation process without a mass analyzer, a plasma implantation process, and a solid state diffusion implantation process. In some embodiments of the present disclosure, a prevailing ion cloud implantation process has been adopted. Specifically, mixed air including borate material such as $B_2H_6/H_2$ and phosphorated material such as PH3/H2 may be implanted according to actual design needs. Specifically, energy for ion implantation may be within a range of 10~200 keV. In a certain embodiment, energy for ion implantation may be within a range of 40~100 keV. Due to the fact that there is one gate insulation layer and two gate insulation layers arranged respectively, lower energy for the first ion implantation process and higher energy for the second ion implantation process are adopted. The amount of ions implanted by the ion implantation processes is within a range of $1\times10^{11}$~$1\times10^{20}$ atoms/cm3. Specifically, the first ion implantation process is called as a Lightly Doped Drain (LDD) implantation process, which needs a lower amount of ions implantation. In a certain embodiment, the amount of ions implanted by the first ion implantation process is within a range of $1\times10^{12}$~$1\times10^{14}$ atoms/cm3. The second ion implantation process is called as a source/drain implantation process, which needs a higher amount of ions implantation. In a certain embodiment, the amount of ions implanted by the second ion implantation process is within a range of $1\times10^{14}$~$1\times10^{18}$ atoms/cm3.

Further, subsequent to the above steps, a source electrode and a drain electrode need to be formed on the second gate electrode 9, and are connected with the source/drain implantation regions 10 through via-holes respectively.

Figure 10:
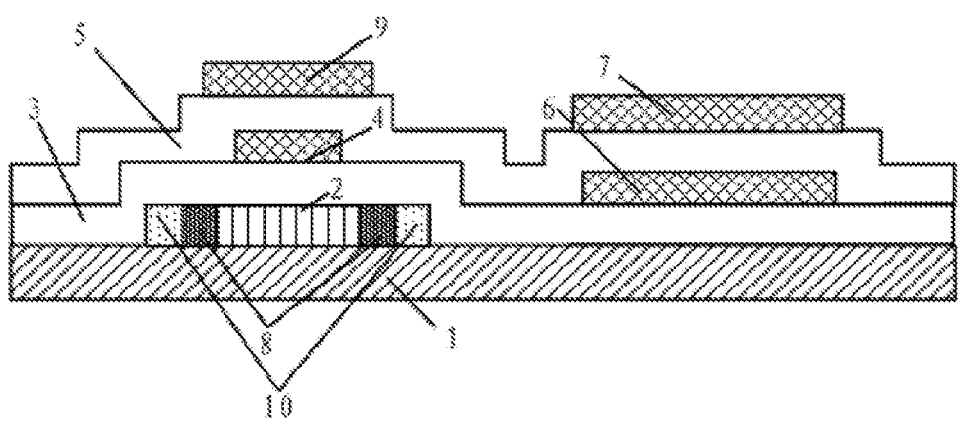
FIG. 10 is a schematic diagram illustrating a structure of an array substrate according to a certain embodiment of the present disclosure.

As shown in FIG. 10, embodiments of the present disclosure provide a P-Si TFT, which includes a polysilicon active layer 2 that includes a center region, two doped regions 8 arranged at two outer sides of the center region respectively, and two source/drain implantation regions 10 arranged at two outer sides of the two doped regions 8 respectively, a first gate insulation layer 3 and a first gate electrode 4 arranged on the active layer 2, wherein projections of two edges at both ends of the first gate electrode 4 coincide with those of two edges at both ends of the center region respectively, and a second gate insulation layer 5 and a second gate electrode 9 arranged on the first gate insulation layer 3 and the first gate electrode 4, wherein projections of two edges at both ends of the second gate electrode 9 coincide with those of two edges at two outermost ends of the two lightly doped regions 8 respectively.

Specifically, impurity concentration of the two doped regions is smaller than that of the two source/drain implantation regions. As a result, the two doped regions are also referred to as lightly doped regions. Further, a thickness of the active layer 2 is within a certain range of 100 Å~3000 Å. In a certain embodiment, a thickness of the active layer 2 is within a certain range of 500 Å~1000 Å.

Specifically, the first gate insulation layer 3 and/or the second gate insulation layer 5 is/are made of a single layer of silica, a single layer of silicon nitride, or a laminate thereof. Further, a thickness of the first gate insulation layer 3 and/or the second gate insulation layer 5 is within a certain range of 500 Å~2000 Å. In a certain embodiment, a thickness of the first gate insulation layer 3 and/or the second gate insulation layer 5 is within a certain range of 600 Å~1500 Å.

Specifically, the first gate electrode 4 and/or the second gate electrode 9 is made of metal and/or metal alloy, such as molybdenum (Mo), aluminum (Al), molybdenum tungsten (MoW). Further, a thickness of the first gate electrode 4 and/or the second gate electrode 9 is within a certain range of 1000 Å~5000 Å. In a certain embodiment, a thickness of the first gate electrode 4 and/or the second gate electrode 9 is within a certain range of 1500 Å~4000 Å. It can be appreciated that a P-Si TFT may achieve its good performance according to the above material and size thereof, for example.

As shown in FIG. 10, embodiments of the present disclosure also provide an array substrate, which includes a base substrate 1, and the above described P-Si TFTs arranged on the base substrate 1.

Specifically, the array substrate may further include storage capacitors each including a storage capacitor bottom electrode 6 formed on the first gate insulation layer 3 and a storage capacitor top electrode 7 formed on the second gate insulation layer 5.

Specifically, the array substrate may further include a buffer layer (not shown) arranged between the base substrate 1 and the polysilicon active layer 2.

Further, embodiments of the present disclosure provide a display device, which includes the above described array substrate.

The display device may be any product or component with a display function, such as a display panel, a screen, a TV, a tablet, a mobile phone, a navigator, etc.

According to the P-Si TFT and the method for fabricating the same, the array substrate for fabricating the same, and a display device provided by embodiments of the present disclosure, there is no need for an additional mask used solely for forming LDD regions, but rather a good-quality TFT having LDD regions and a storage capacitor are formed simultaneously with the first and second gate electrodes as ion implantation masks, by adjusting procedures of ion implantation processes and a corresponding gate electrode structure. Accordingly, due to the fact that there are lightly-doped and high-resistance LDD regions for a TFT, it can therefore reduce leakage electricity thereof and improve stability thereof, with the process complexity unchanged.

The above are merely example embodiments of the present disclosure and shall not be used to limit the scope of the present disclosure. It should be noted that, a person skilled in the art may make improvements, substitutions and modifications without departing from the principle of the present disclosure, and these improvements, substitutions and modifications shall also fall within the scope of the present disclosure.

What is claimed is:

1. A method for fabricating a Polysilicon Thin-Film Transistor (P-Si TFT), said method comprising:
    forming a polysilicon active layer;
    forming a first gate insulation layer and a first gate electrode sequentially on the active layer, wherein a projection of the first gate electrode is located between first and second ends of the active layer;
    conducting a first ion implantation process on the active layer using the first gate electrode as a mask to form a doped region at each of the first and second ends of the active layer;
    forming a second gate insulation layer and a second gate electrode sequentially on the first gate insulation layer and the first gate electrode, wherein a projection of each end of the second gate electrode is located between the projection of the first electrode and a respective end of the active layer; and
    conducting a second ion implantation process on the active layer by using the second gate electrode as an additional mask to form two source/drain implantation regions at two outer sides of the two doped regions of the active layer, wherein an impurity concentration of the doped regions is smaller than that of the source/drain implantation regions.

2. The method according to claim 1, wherein an amount of ions implanted by the first ion implantation process is lower than an amount of ions implanted by the second ion implantation process.

3. The method according to claim 1, wherein:
    the amount of ions implanted by the first ion implantation process is within a range of $1\times10^{12}$~$1\times10^{14}$ atoms/cm$^3$; and
    the amount of ions implanted by the second ion implantation process is within a range of $1\times10^{14}$~$1\times10^{18}$ atoms/cm$^3$.

4. A method for fabricating an array substrate, said method comprising:
    providing a base substrate; and
    forming Polysilicon Thin-Film Transistors (P-Si TFTs) according to claim 1 on the base substrate.

5. The method according to claim 4, further comprising:
    forming a storage capacitor bottom electrode on the first gate insulation layer corresponding to a predetermined storage capacitor region; and
    forming a storage capacitor top electrode on the second gate insulation layer corresponding to the storage capacitor bottom electrode.

6. The method according to claim 5, wherein the storage capacitor bottom electrode and the first gate electrode are formed simultaneously, and wherein the storage capacitor top electrode and the second gate electrode are formed simultaneously.

7. The method according to claim 5, further comprising:
    forming a buffer layer on the base substrate, subsequent to providing the base substrate and prior to forming the polysilicon active layer.

8. The method according to claim 7, wherein the buffer layer is made of silica, silicon nitride, or a laminate thereof.

9. A Polysilicon Thin-Film Transistor (P-Si TFT) comprising:
    a polysilicon active layer that includes a center region, two doped regions arranged at each of the first and second ends of the center region, and two source/drain implantation regions arranged at respective outer sides of the two doped regions;
    a first gate insulation layer and a first gate electrode arranged on the active layer, wherein a projection of each end of the first gate electrode coincides with a respective end of the center region; and
    a second gate insulation layer and a second gate electrode arranged on the first gate insulation layer and the first gate electrode, wherein a projection at each end of the second gate electrode coincides with a respective end of the two doped regions, and wherein an impurity concentration of the doped regions is smaller than that of the source/drain implantation regions.

10. The P-Si TFT according to claim 9, wherein a thickness of the active layer is within a certain range of 100 Å~3000 Å.

11. The P-Si TFT according to claim 9, wherein at least one of the first gate insulation layer and the second gate insulation layer is made of at least one of silica, silicon nitride, and a laminate thereof, and wherein a thickness thereof is within a certain range of 500 Å~2000 Å.

12. The P-Si TFT according to claim 9, wherein at least one of the first gate electrode and the second gate electrode is made of at least one of metal and metal alloy, and wherein a thickness thereof is within a certain range of 1000 Å~5000 Å.

13. An array substrate comprising:
    a base substrate; and
    Polysilicon Thin-Film Transistors (P-Si TFTs) according to claim 9 arranged on the base substrate.

14. The array substrate according to claim 13, further comprising:
    storage capacitors, wherein each storage capacitor includes a storage capacitor bottom electrode formed on the first gate insulation layer and a storage capacitor top electrode formed on the second gate insulation layer.

15. The array substrate according to claim 13, further comprising:
    a buffer layer arranged between the base substrate and the polysilicon active layer.

16. The array substrate according to claim 15, wherein the buffer layer is made of silica, silicon nitride, or a laminate thereof.

17. A display device comprising:
    the array substrate according to claim 13.

18. A display device comprising the array substrate according to claim 14.

19. A display device comprising the array substrate according to claim 15.

20. A display device comprising the array substrate according to claim 16.

* * * * *